(12) United States Patent
Stephenson et al.

(10) Patent No.: US 10,530,193 B2
(45) Date of Patent: Jan. 7, 2020

(54) PASSIVE MAGNETIC FIELD ATTENUATION

(71) Applicant: Wireless Advanced Vehicle Electrification, Inc., Salt Lake City, UT (US)

(72) Inventors: James Stephenson, Salt Lake City, UT (US); Patrice Lethelier, Salt Lake City, UT (US)

(73) Assignee: Wireless Advanced Vehicle Electrification, Inc., Salt Lake City, UT (US)

( * ) Notice: Subject to any disclaimer, the term of this patent is extended or adjusted under 35 U.S.C. 154(b) by 129 days.

(21) Appl. No.: 15/805,059

(22) Filed: Nov. 6, 2017

(65) Prior Publication Data
US 2018/0131239 A1    May 10, 2018

Related U.S. Application Data

(60) Provisional application No. 62/417,981, filed on Nov. 4, 2016.

(51) Int. Cl.
| | |
|---|---|
| *H02J 50/70* | (2016.01) |
| *H02J 50/10* | (2016.01) |
| *H02J 7/02* | (2016.01) |
| *H05K 7/20* | (2006.01) |
| *H05K 9/00* | (2006.01) |

(52) U.S. Cl.
CPC ............. *H02J 50/70* (2016.02); *H02J 7/025* (2013.01); *H02J 50/10* (2016.02); *H05K 7/2039* (2013.01); *H05K 9/0081* (2013.01)

(58) Field of Classification Search
CPC .. H02J 50/70; H02J 50/10; H02J 50/12; H02J 50/80; H02J 50/90; H02J 7/025; H02J 7/02; H02J 5/005; B60L 53/12; H03H 7/40
USPC .................................. 307/104, 9.1, 10.1, 86
See application file for complete search history.

(56) References Cited

U.S. PATENT DOCUMENTS

| | | | | |
|---|---|---|---|---|
| 2013/0300204 A1* | 11/2013 | Partovi | ................... | H01F 38/14 307/104 |
| 2014/0015522 A1* | 1/2014 | Widmer | ............... | G01D 5/2006 324/239 |
| 2014/0125140 A1* | 5/2014 | Widmer | .................. | H02J 7/025 307/104 |

(Continued)

FOREIGN PATENT DOCUMENTS

EP    3112889 A1 *  1/2017  ............. G01R 33/34

*Primary Examiner* — Rexford N Barnie
*Assistant Examiner* — Jagdeep S Dhillon
(74) *Attorney, Agent, or Firm* — Kunzler Bean & Adamson, PC; Bruce R. Needham

(57) ABSTRACT

A first apparatus for passive magnetic field attenuation comprises a wireless power transfer ("WPT") pad comprising one or more windings and a ferrite structure adjacent to the one or more windings, and a passive magnetic flux cancellation ("PMFC") structure located adjacent to the WPT pad. The PMFC structure includes one or more vertical shields oriented substantially perpendicular to the WPT pad, where each of the one or more vertical shields attenuates an electromagnetic field, and a vertical shield retention structure that retains each of the one or more vertical shields in position with respect to the WPT pad.

20 Claims, 12 Drawing Sheets
(5 of 12 Drawing Sheet(s) Filed in Color)

(56) References Cited

U.S. PATENT DOCUMENTS

2014/0266546 A1* 9/2014 Mao .................... H01F 27/2804
                                                            336/200
2017/0003360 A1* 1/2017 Funk ...................... G01R 33/34

* cited by examiner

Legend
High magnetic field (~100uT)  Medium magnetic field (~70uT)  Low magnetic field (~10-20 uT)

PASSIVE MAGNETIC FIELD ATTENUATION

CROSS-REFERENCES TO RELATED APPLICATIONS

This application claims the benefit of U.S. Provisional Patent Application No. 62/417,981 entitled "PASSIVE MAGNETIC FIELD ATTENUATION" and filed on Nov. 11, 2016 for James Stephenson, which is incorporated herein by reference.

FIELD

This invention relates to wireless power transfer and more particularly relates to passive magnetic field attenuation during wireless power transfer.

BACKGROUND

Wireless power transmission ("WPT") equipment generates an electromagnetic field. Typically, the electromagnetic field is not all directed between a primary pad and a secondary pad. Often some of the electromagnetic field extends in unintended directions, which may pose a safety hazard.

SUMMARY

Apparatuses for passive magnetic field attenuation are disclosed. A first apparatus for passive magnetic field attenuation comprises a wireless power transfer ("WPT") pad comprising one or more windings and a ferrite structure adjacent to the one or more windings, and a passive magnetic flux cancellation ("PMFC") structure located adjacent to the WPT pad. The PMFC structure includes one or more vertical shields oriented substantially perpendicular to the WPT pad, where each of the one or more vertical shields attenuates an electromagnetic field, and a vertical shield retention structure that retains each of the one or more vertical shields in position with respect to the WPT pad.

In one embodiment, each vertical shield of the one or more vertical shields is oriented in a plane substantially perpendicular to the WPT pad, where each vertical shield is in a different plane. In another embodiment, a portion of each of the one or more vertical shields are located adjacent to each side of the WPT pad. Each side of the WPT pad is perpendicular to a direction of wireless power transfer of the WPT pad. The direction of wireless power transfer is a direction where another pad is aligned to engage in wireless power transfer. In another embodiment, each of the one or more vertical shields is placed in one or more locations adjacent to the WPT pad where magnetic flux originating in the WPT pad is not useful for wireless power transfer with another WPT pad.

In some embodiments, each of the one or more vertical shields includes a metal subject to an eddy current when exposed to a magnetic field from the WPT pad. In another embodiment, each of the one or more vertical shields is one or more of aluminum and copper. In some embodiments, each of the one or more vertical shields includes a ferrite material with a size and thickness to shunt an electromagnetic field generated by the windings and present at the one or more vertical shields.

In some embodiments, a thickness of each vertical shield, a vertical shield size, and/or a vertical shield spacing are chosen to attenuate magnetic flux originating from the WPT pad to within a specified level at a particular distance from the WPT pad. In some embodiments, the one or more vertical shields are thermally coupled to the WPT pad and/or electronics connected to the WPT pad and a thickness of each vertical shield, a vertical shield size, and/or a vertical shield spacing are chosen to transfer heat from one or more of the WPT pad and the electronics connected to the WPT pad. In a further embodiment, the one or more vertical shields are thermally coupled to one or more of the WPT pad and electronics connected to the WPT pad through the vertical shield retention structure.

In some embodiments, the vertical shield retention structure is coupled to each of the one or more vertical shields and to the WPT pad. In some embodiments, the vertical shield retention structure includes two or more parts, and each part of the vertical shield retention structure is adjacent to a side of the WPT pad where magnetic flux attenuation is desired. In some embodiments, the vertical shield retention structure includes a non-conductive material located between each of the one or more vertical shields. In some embodiments, each of the one or more vertical shields extend away from the vertical shield retention structure in a direction of wireless power transfer. In a further embodiment, the WPT pad is a transmitter WPT pad and each of the one or more vertical shields extend above the transmitter WPT pad in the direction of wireless power transfer to a height less than a driving surface over the transmitter WPT pad. In another further embodiment, the WPT pad is a receiver WPT pad connected to an underside of a vehicle and each of the one or more vertical shields extend below the receiver WPT pad to a height less than a minimum clearance above a driving surface where the vehicle travels.

A second apparatus for passive magnetic field attenuation includes a WPT pad with one or more windings and a ferrite structure adjacent to the one or more windings, and a PMFC structure located adjacent to the WPT pad. The PMFC structure includes a vertical shield oriented substantially perpendicular to the WPT pad, where the vertical shields include a ferrite, and a vertical shield retention structure that retains the vertical shield in position with respect to the WPT pad.

In some embodiments, the vertical shield is oriented in a plane substantially perpendicular to the WPT pad. In some embodiments, the ferrite material has a size and thickness to shunt an electromagnetic field generated by the windings and present at the vertical shield.

A third apparatus for passive magnetic field attenuation includes a WPT pad comprising one or more windings and a ferrite structure adjacent to the one or more windings, and a PMFC structure located adjacent to the WPT pad. The PMFC structure includes a plurality of vertical shields oriented substantially perpendicular to the WPT pad, where each of the plurality of vertical shields attenuates an electromagnetic field, and where each of the plurality of vertical shields includes a metal subject to an eddy current when exposed to a magnetic field from the WPT pad, and a vertical shield retention structure that retains each of the plurality of vertical shields in position with respect to the WPT pad.

BRIEF DESCRIPTION OF THE DRAWINGS

In order that the advantages of the invention will be readily understood, a more particular description of the invention briefly described above will be rendered by reference to specific embodiments that are illustrated in the appended drawings. The patent or application file contains at least one drawing executed in color. Copies of this patent or patent application publication with color drawing(s) will be provided by the Office upon request and payment of the necessary fee. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 1:
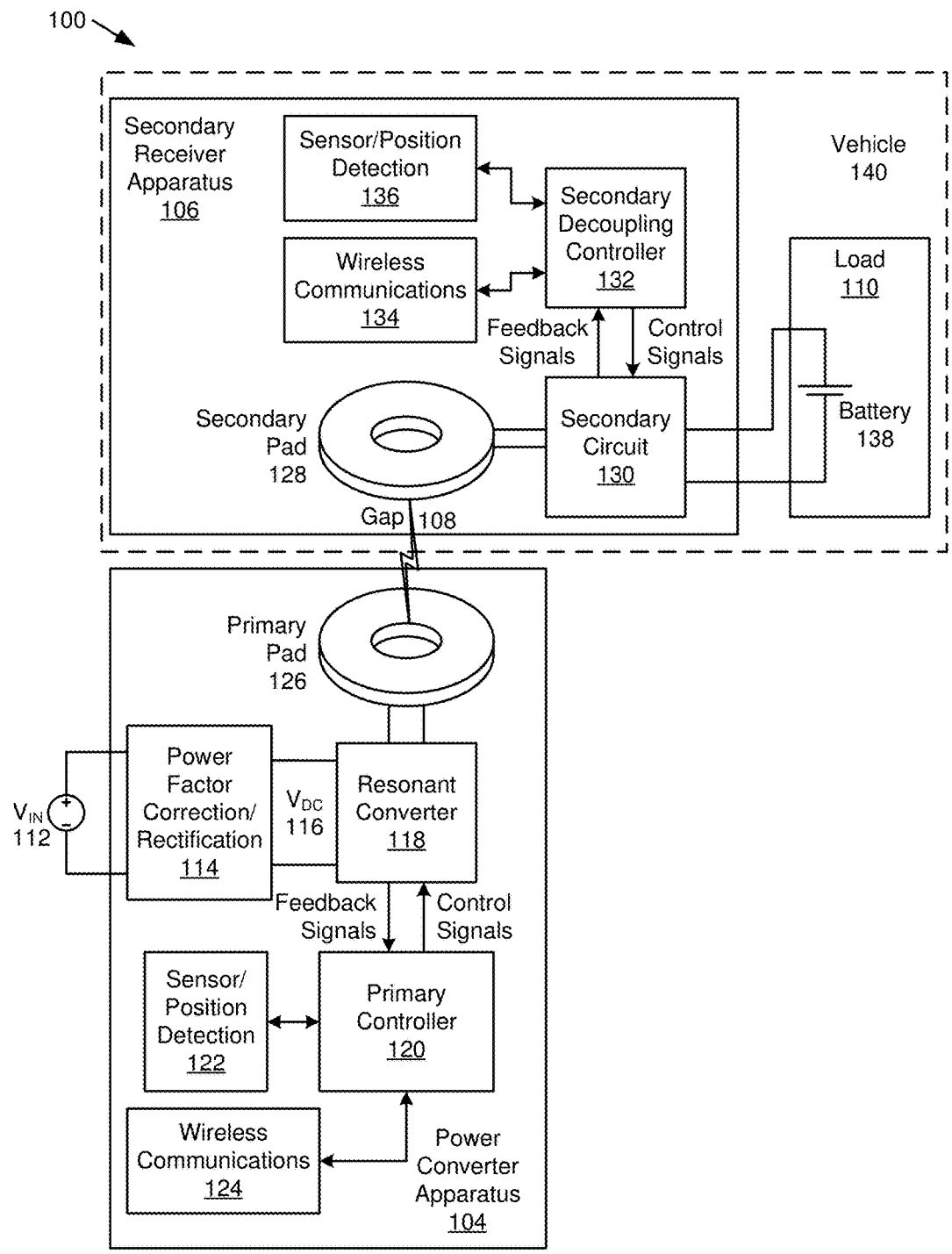
FIG. 1 is a schematic block diagram illustrating one embodiment of a system with a low voltage wireless power transfer ("WPT") pad.

FIG. 1 is a schematic block diagram illustrating one embodiment of a wireless power transfer ("WPT") system 100 with a low voltage WPT pad. The WPT system 100 includes a power converter apparatus 104 and a secondary receiver apparatus 106 separated by a gap 108, and a load 110, which are described below.

The WPT system 100 includes a power converter apparatus 104 that receives power from a power source 112 and transmits power over a gap 108 to a secondary receiver apparatus 106, which transfers power to a load 110. The power converter apparatus 104, in one embodiment, may be called a switching power converter and includes a resonant converter 118 that receives a direct current ("DC") voltage from a DC bus 116.

In one embodiment, the power source 112 provides DC power to the DC bus 116. In another embodiment, the power source 112 is an alternating current ("AC") power source, for example from a building power system, from a utility, from a generator, etc. and the power converter apparatus 104 includes a form of rectification to provide DC power to the DC bus 116. For example, the rectification may be in the form of a power factor correction and rectification circuit 114. In the embodiment, the power factor correction and rectification circuit 114 may include an active power factor correction circuit, such as a switching power converter. The power factor correction and rectification circuit 114 may also include a full-bridge, a half-bridge rectifier, or other rectification circuit that may include diodes, capacitors, surge suppression, etc.

The resonant converter 118 may be controlled by a primary controller 120, which may vary parameters within the resonant converter 118, such as conduction time, conduction angle, duty cycle, switching, etc. The primary controller 120 may receive information from sensors and position detection 122 within or associated with the power converter apparatus 104. The primary controller 120 may also receive information wirelessly from the secondary receiver apparatus 106.

The power converter apparatus 104 includes a primary pad 126 (i.e. a primary WPT pad) that receives power from the resonant converter 118. In one embodiment, portions of the resonant converter 118 and primary pad 126 form a resonant circuit that enables efficient wireless power transfer across the gap 108. In another embodiment, the power converter apparatus 104 includes a switching power converter that is not a resonant converter. The gap 108, in some embodiments includes an air gap, but may also may partially or totally include other substances. For example, where the primary pad 126 is in a roadway, the gap 108 may include a resin, asphalt, concrete or other material just over the windings of the primary pad 126 in addition to air, snow, water, etc. between the primary pad 126 and a secondary pad 128 located in the secondary receiver apparatus 106.

The secondary receiver apparatus 106 includes a secondary pad 128 (i.e. a secondary WPT pad) connected to a secondary circuit 130 that delivers power to the load 110. The secondary receiver apparatus 106 may also include a secondary decoupling controller 132 that controls the secondary circuit 130 and may also be in communication with sensors and/or position detection 136 and wireless communications 134 coupled to the power converter apparatus 104.

In one embodiment, the secondary receiver apparatus 106 and load 110 are part of a vehicle 140 that receives power from the power converter apparatus 104. The load 110 may include a battery 138, a motor, a resistive load, a circuit or other electrical load. For example, the WPT system 100 may transfer power to a portable computer, a consumer electronic device, to an industrial load, or other portable load that would benefit from receiving power wirelessly.

In one embodiment, the secondary circuit 130 includes a portion of resonant circuit that interacts with the secondary pad 128 and that is designed to receive power at a resonant frequency. In another embodiment, the secondary circuit 130 includes a power conditioning circuit that is not a resonant circuit. The secondary circuit 130 may also include a rectification circuit, such as a full-bridge rectifier, a half-bridge rectifier, and the like. In another embodiment, the secondary circuit 130 includes a power converter of some type that receives power from the resonant circuit/rectifier and actively controls power to the load 110. For example, the secondary circuit 130 may include a switching power converter. In another embodiment, the secondary circuit 130 includes passive components and power to the load 110 is controlled by adjusting power in the power converter apparatus 104. In another embodiment, the secondary circuit 130 includes an active rectifier circuit that may receive and transmit power. One of skill in the art will recognize other forms of a secondary circuit 130 appropriate for receiving power from the secondary pad 128 and delivering power to the load 110.

The resonant converter 118, in one embodiment, includes an active switching section coupled to a resonant circuit formed with components of the resonant converter 118 and the primary pad 126. The resonant converter 118 is described in more detail with regard to FIG. 2.

Figure 2:
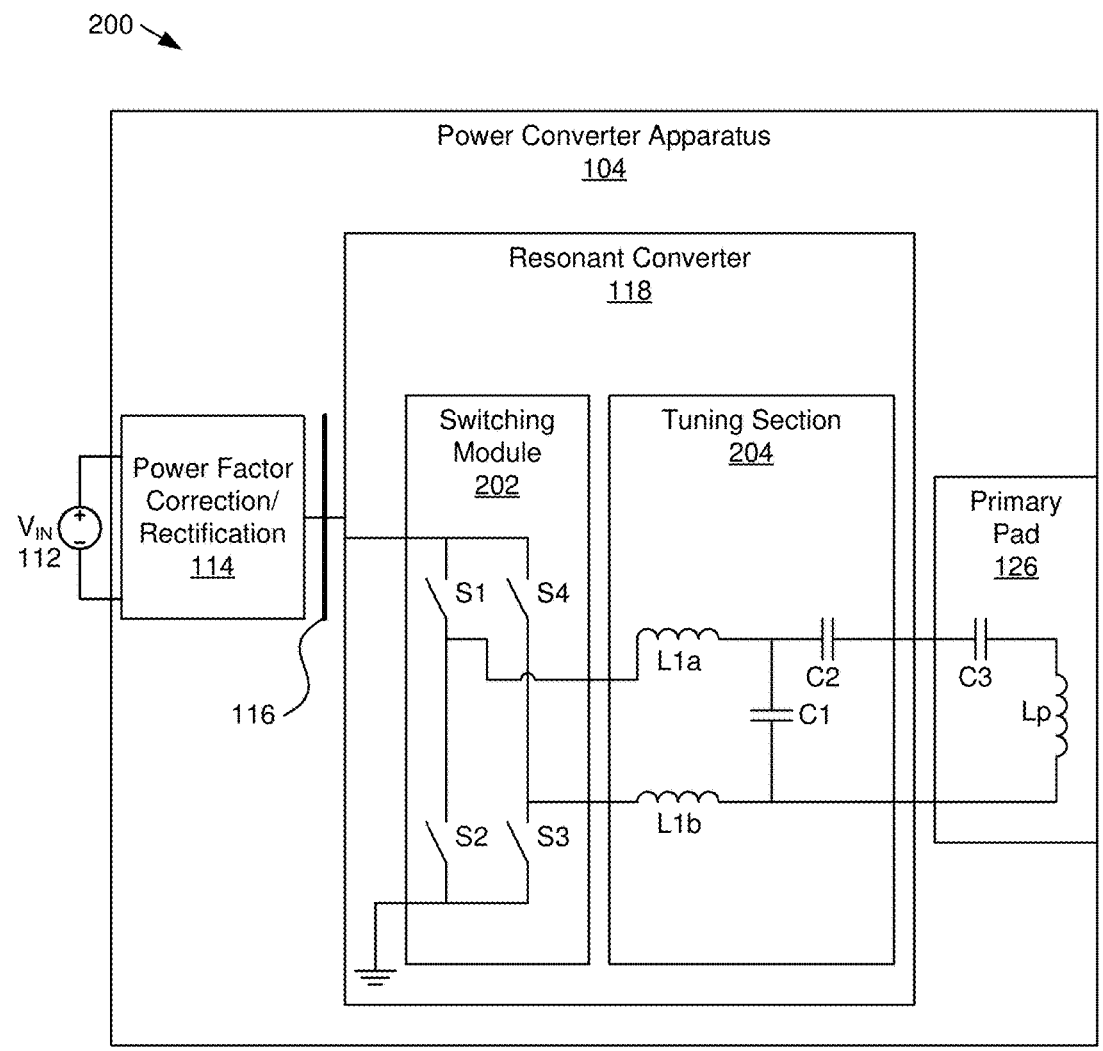
FIG. 2 is a schematic block diagram illustrating one embodiment of a power converter apparatus.

FIG. 2 is a schematic block diagram illustrating one embodiment of a power converter apparatus 104. The power converter apparatus 104 is connected to a power source 112 and includes a power factor correction and rectification circuit 114 connected to a DC bus 116 feeding a resonant converter 118 connected to a primary pad 126 as described with regard to the WPT system 100 of FIG. 1.

The resonant converter 118 includes a switching module 202 and a tuning section 204. In one embodiment, the switching module 202 includes four switches configured to connect the DC bus 116 and to ground. Typically, switches S1 and S3 close while switches S2 and S4 are open and vice-versa. When switches S1 and S3 are closed, the DC bus 116 is connected to a positive connection of the tuning section 204 through inductor L1a and the ground is connected to the negative connection of the tuning section 204 through inductor L1b while switches S2 and S4 are open. When switches S2 and S4 are closed, the ground is connected to the positive terminal of the tuning section 204 and the DC bus 116 is connected to the positive connection of the tuning section 204. Thus, the switching module alternates connection of the DC bus 116 and ground to the tuning section 204 simulating an AC waveform. The AC waveform is typically imperfect due to harmonics.

Typically, switches S1-S4 are semiconductor switches, such as a metal-oxide-semiconductor field-effect transistor ("MOSFET"), a junction gate field-effect transistor ("JFET"), a bipolar junction transistor ("BJT"), an insulated-gate bipolar transistor ("IGBT") or the like. Often the switches S1-S4 include a body diode that conducts when a negative voltage is applied. In some embodiments, the timing of opening and closing switches S1-S4 are varied to achieve various modes of operations, such as zero-voltage switching.

The tuning section 204 of the resonant converter 118 and the primary pad 126 are designed based on a chosen topology. For example, the resonant converter 118 and primary pad 126 may form an inductor-capacitor-inductor ("LCL") load resonant converter, a series resonant converter, a parallel resonant converter, and the like. The embodiment depicted in FIG. 2 includes an LCL load resonant converter.

Resonant converters include an inductance and capacitance that form a resonant frequency. When a switching frequency of the tuning section 204 is at or close to the resonant frequency, voltage with the tuning section 204 and primary pad 126 often increases to voltages levels higher than the voltage of the DC bus 116. For example, if the voltage of the DC bus 116 is 1 kilovolt ("kV"), voltage in the tuning section 204 and resonant converter 118 may be 3 kV or higher. The high voltages require component ratings, insulation ratings, etc. to be high enough for expected voltages.

The primary pad 126 includes capacitor C3 and inductor Lp while the tuning section 204 includes series capacitor C2. Capacitors C2 and C3 add to provide a particular capacitance that forms a resonant frequency with inductor Lp. In some embodiments, the power converter apparatus 104 includes a single series capacitor in the tuning section 204 or in the primary pad 126. While the FIG. 2 is focused on the resonant converter 118 and primary pad 126, the secondary receiver apparatus 106 includes a secondary pad 128 and a secondary circuit 130 that typically includes a tuning section 204 where the inductance of the secondary pad 128 and capacitance of the tuning section 204 of the secondary circuit 130 form a resonant frequency and the secondary pad 128 and secondary circuit 130 have voltage issues similar to the primary pad 126 and resonant converter 118. In other embodiments, the tuning section 204 and primary pad 126 are not designed to produce a resonance, but instead condition voltage from the switching module 202. For example, the tuning section 204 may filter out harmonic content without filtering a switching frequency.

Figure 3:
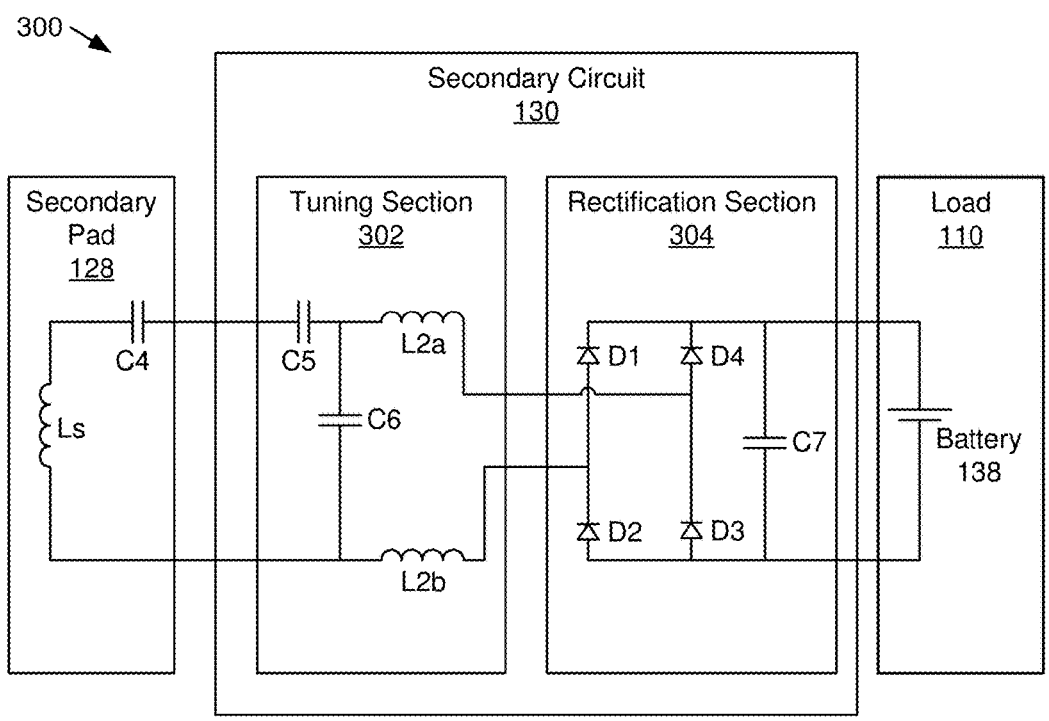
FIG. 3 is a schematic block diagram illustrating one embodiment of a secondary circuit feeding a load.

FIG. 3 is a schematic block diagram illustrating one embodiment 300 of a secondary circuit 130 feeding a load 110. A secondary pad 128 feeds a tuning section 302 within the secondary circuit 130 and the tuning section 302 fees a rectification section 304 in the secondary circuit 130, which feeds a load 110.

The secondary pad 128 includes one or more windings arranged to receive power from a primary pad 126. The secondary pad 128 may include a ferrite structure and windings arranged in a pattern that efficiently receives power from the primary pad 126. In one embodiment, the secondary pad 128 mirrors the primary pad 126 transmitting power. In another embodiment, the secondary pad 128 differs from the primary pad 126. Typically, the secondary pad 128 includes an inductance Ls formed as a result of the windings and the ferrite structure of the secondary pad 128. In one embodiment, the secondary pad 128 includes a capacitor C4.

The tuning section 302 includes one or more capacitors C5, C6 and inductors L2a, L2b that are arranged to form a resonant circuit with the secondary pad 128 with a resonant frequency. In some embodiments, capacitor C6 is not present. In one embodiment, the resonant frequency matches a resonant frequency of the primary pad 126 transmitting power. Typically, a resonant frequency is formed between the inductor Ls of the secondary pad 128 and series capacitors C4 and C5 of the secondary pad 128 and/or tuning section 302. In some embodiments, the secondary pad 128 or the tuning section 302 include a single series capacitor C4 or C5. Other capacitors (e.g. C6) and inductors (e.g. L2a, L2b) may form a low pass filter to reduce voltage ripple at the resonant frequency. In other embodiments, a low-pass filter is included after rectification elements in the rectification section 304. For example, a capacitor C7 may be included. One of skill in the art will recognize other configurations of the tuning section 302 that form a resonant tank with the secondary pad 128 and pass energy to the rectification section 304 or another suitable circuit.

A rectification section 304 includes diodes, switches, or other rectification elements to convert alternating current ("AC") power to direct current ("DC") power. The rectification section 304 depicted in FIG. 3 includes a full bridge rectifier with four diodes D1-D4. In some embodiments, the diodes D1-D4 are replaced with active elements, such as switches, which may be used to reduce harmonics, reduce power consumption, and the like. For example, the rectification section 304 may include a switching power converter that controls an output voltage to the load 110.

The load 110, in one embodiment is a battery 138. In other embodiments, the load 110 may include other components, such as a motor, a resistive load, electronics, and the like. In one embodiment, the secondary pad 128, secondary circuit 130 and load 110 are part of a vehicle 140. In other embodiments, the secondary pad 128, secondary circuit 130 and load 110 are part of a computing device, a smartphone, and the like.

Figure 4:
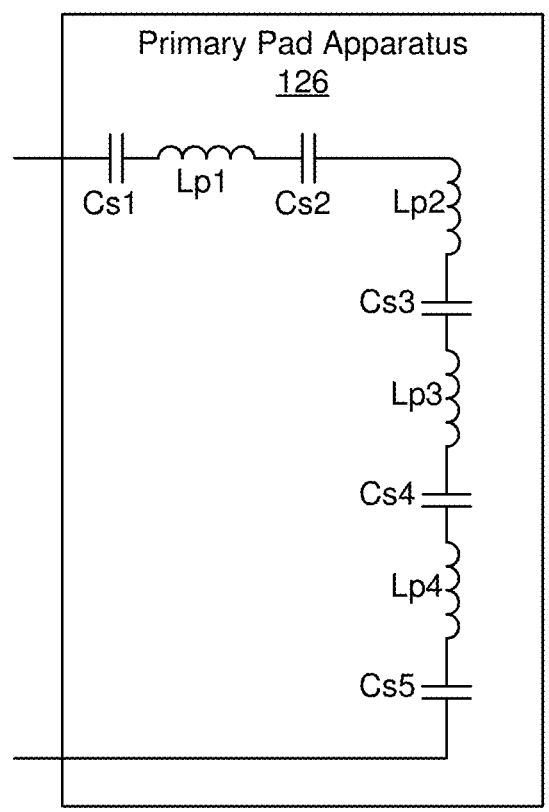
FIG. 4 is a schematic block diagram illustrating one embodiment of a low voltage WPT pad.

FIG. 4 is a schematic block diagram illustrating one embodiment of a low voltage WPT pad. In the embodiment, the capacitance Cs has been distributed in five capacitors, Cs1, Cs2, Cs3, Cs4 and Cs5. The winding of the primary pad 126, which forms an inductance, is divided into four sections, Lp1, Lp2, Lp3, Lp4. The capacitors Cs2, Cs3, Cs4 and Cs5 are distributed between winding sections as depicted. While five capacitors and four winding sections are depicted, one of skill in the art will recognize that other numbers of capacitors and winding sections may be used. In addition, the low voltage WPT pad may be for a primary or a secondary pad.

Figure 5:
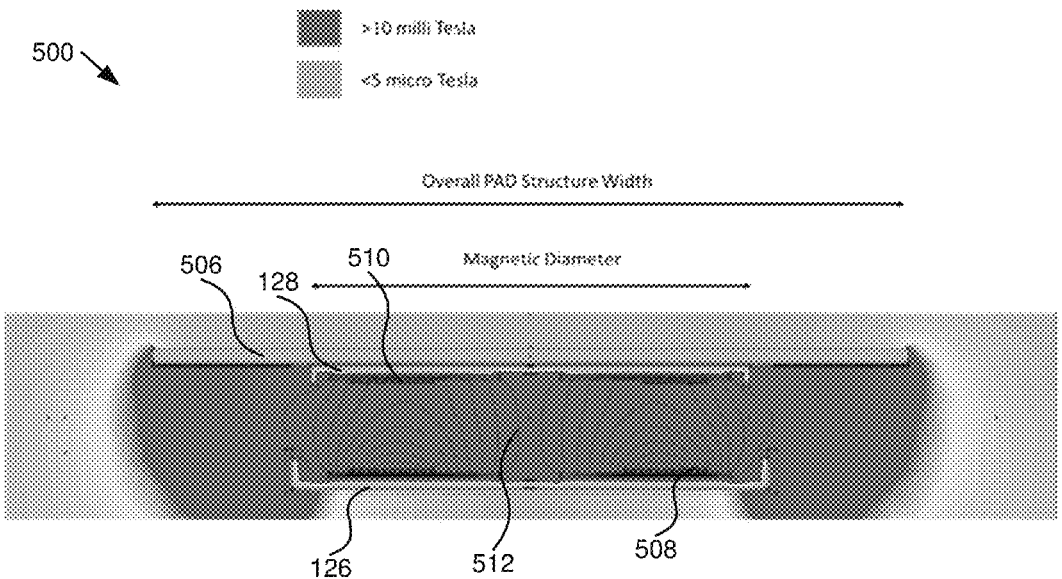
FIG. 5 is a simulation result for a 200 kilowatt ("kW") WPT system without passive magnetic field attenuation.

FIG. 5 is a simulation result for a 200 kilowatt ("kW") wireless power transfer ("WPT") system 100 without passive magnetic field attenuation. The 200 kW WPT system includes a primary pad 126 and a secondary pad 128 for wireless power transfer where the secondary pad 128 may be connected the underside of a vehicle 140 or other structure. The vehicle 140 or other structure may be represented as a horizontal shield 506 that may be an overall pad structure width or may be equal to or less than the width of the vehicle 140 or structure. (The horizontal shield 106 may be a horizontal shield 1308, as described below.) The primary pad 126 and secondary pad 128 each include one or more windings 508, 510 and a ferrite structure where the windings 508, 510 are adjacent to the ferrite structure. In one embodiment, adjacent to the ferrite structure means that the coils are on a side of the ferrite structure, either directly touching the ferrite structure or separated by a small distance. In another embodiment, adjacent to the ferrite structure means that the windings 508, 510 wrap around at least a portion of the ferrite structure and may extend all the way around the ferrite structure.

A power source (not shown) injects a signal into the windings 508 of the primary pad 126 which generates a magnetic field that couples the windings 510 of the secondary pad 128 so that power is transferred wirelessly to the windings 510 of the secondary pad 128. Electronic circuits connected to the secondary pad 128 condition received power and provide power to a load, such as a battery, an electric motor, and the like.

Some areas between the primary and secondary pads 126, 128 and to the sides of the primary and secondary pads 126, 128 have a magnetic field strength above 10 milli ("m") Tesla. Other areas above the secondary pad 128 and below the primary pad 126 have a magnetic field strength below 5 micro ("μ") Tesla, which may be mostly attributed to the horizontal shield 506 and the ferrite structure of the primary and secondary pads 126, 128. In one embodiment, a goal may be to have a magnetic field strength on the sides of the primary and secondary pads 126, 128 at edges of a vehicle 140 to be less than 5μ Tesla. Magnetic flux lines 512 are depicted showing coupling between the windings 508, 510 of the primary and secondary pads 126, 128 along with leakage magnetic flux that extends laterally as well as above and below the primary and secondary pads 126, 128. The unshielded design depicted in FIG. 5 may be inadequate to meet design and safety standards.

Figure 6:
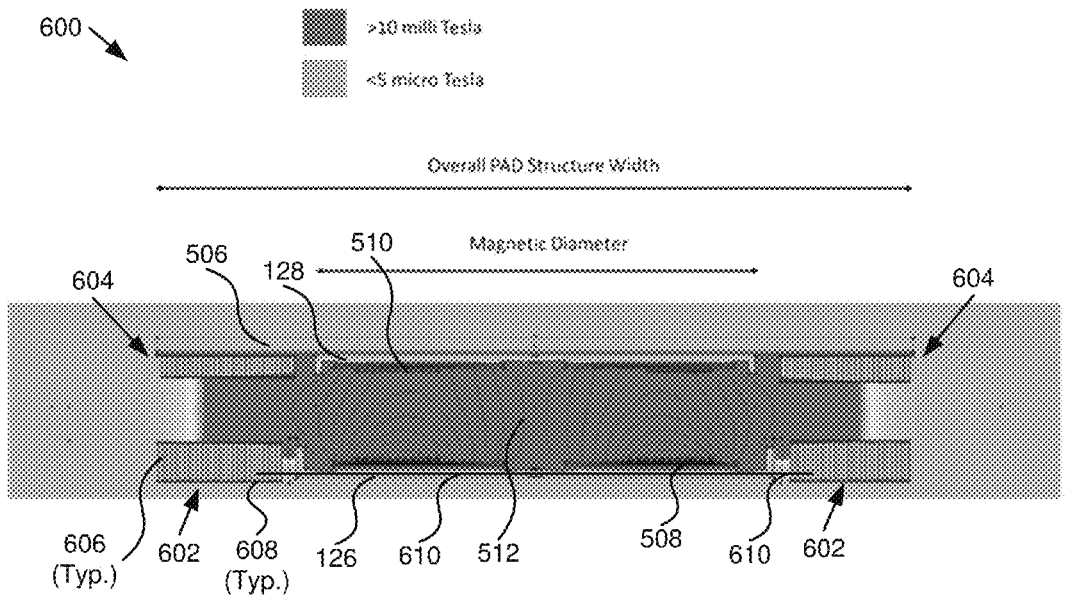
FIG. 6 is a simulation result for a 200 kW WPT system with passive magnetic field attenuation.
Figure 11:
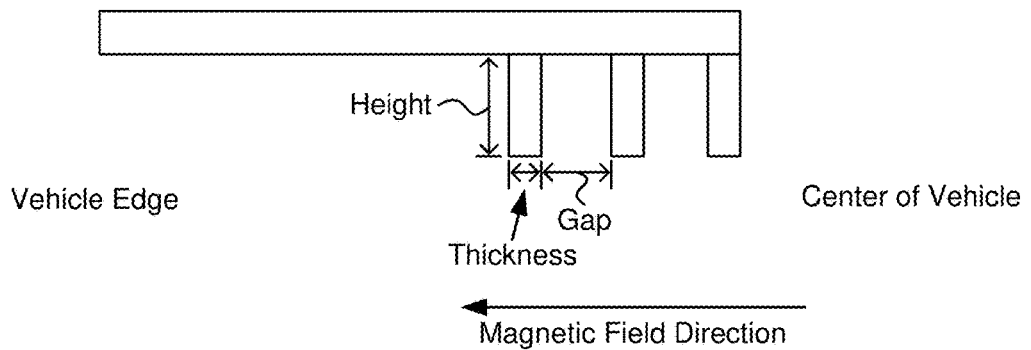
FIG. 11 is a schematic block diagram illustrating parameters of vertical shields of a passive field cancellation apparatus.

FIG. 6 is a simulation result 200 for a 200 kW WPT system 100 with passive magnetic field attenuation. The WPT system 100 includes a primary pad 126 and a secondary pad 128 for wireless power transmission with a horizontal shield 506 over the secondary pad 128, and windings 508, 510 as described above with regard to the WPT system 100 in FIG. 5. In addition, the WPT system 100 includes a passive magnetic flux cancellation ("PMFC") structure depicted with a portion 602 adjacent to either side of the primary pad 126 and a portion 604 adjacent to either side of the secondary pad 128. The PMFC structure includes, for the primary pad 126, one or more vertical shields 606 oriented substantially perpendicular to the primary pad 126 and a vertical shield retention structure 608 that retains the one or more vertical shields 606 in position with respect to the primary pad 126. The one or more vertical shields 606 are metallic. The PMFC structure includes, in one embodiment, for the secondary pad 128, one or more vertical shields 606 oriented substantially perpendicular to the secondary pad 128 and a vertical shield retention structure 608 that retains the vertical shields in position with respect to the secondary pad 128. In the simulation, the height of each vertical shield 606 is 2.57 inches, the horizontal gap between vertical shields 606 is 0.37 inches, and the width of the vertical shields is 0.125 inches and the vertical shields 606 were aluminum. FIG. 11 depicts the how the height, width and gap are measured.

Hereinafter, oriented substantially perpendicular to a WPT pad, such as the primary or secondary pads 126, 128 means that the one or more vertical shields 606 may be perpendicular to the WPT pad or may be slightly angled away from perpendicular to the WPT pad. Hereinafter, a WPT pad may be a primary pad 126 or a receiver pad. For example, a vertical shield 606 may be oriented 85 degrees instead of 90 degrees with respect to the WPT pad, where the angle of the WPT pad is along an axis 610 through the WPT pad, which may be perpendicular to a direction of wireless power transfer. In another example, substantially perpendicular may mean that a vertical shield 606 may be oriented 80 degrees instead of 90 degrees with respect to the WPT pad. Any angle that is perpendicular (i.e. 90 degrees) or close to 90 degrees may be considered substantially perpendicular.

Note that the system 200 of FIG. 6 is a section view so that a PMFC structure for one or more of the WPT pads 126, 128 may include one or more vertical shields 606 along other sides of a particular pad (e.g. 126 or 128). For example, if the primary pad 126 and/or the secondary pad 128 are circular, the one or more vertical shields 606 may be circular in the form of concentric rings around the WPT pads 126, 128. In another example, where the primary pad 126 and/or the secondary pad 128 are square or rectangular, one or more vertical shields 606 may be adjacent to one side, two sides, four sides, etc. in locations where magnetic field attenuation is desired. In one example where the WPT system 100 is for a vehicle charging system and the vehicle 140 is rectangular, when the vehicle 140 with a secondary pad 128 is over a ground-mounted primary pad 126, the primary pad 126 and receiver pad 128 may be closer to sides of the vehicle 140 than to the front or back of the vehicle 140. Thus, one or more vertical shields 606 may be placed on sides of the primary and secondary pads 126, 128 closest to the sides of the vehicle 140 while sides of the primary and secondary pads 126, 128 oriented toward the front and back of the vehicle 140 where the primary and secondary pads 126, 128 are further away from the front and back of the vehicle 140 may not include one or more vertical shields 606 due to less potential exposure of a person near the vehicle 140.

In other embodiments, for example where a secondary pad 128 is close to the front or back of the vehicle 140, vertical shields may be included on the sides of at least the secondary pad 128 close to the front or back of the vehicle 140. Magnetic field strength near edges of the primary and secondary pads 126, 128 may be used to determine where one or more vertical shields 606 are appropriate.

As depicted in the WPT system 100 of FIG. 6, the magnetic flux lines between the WPT pads 126, 128 are the same or similar as the WPT system 100 of FIG. 5, but in the areas between the vertical shields 606, the magnetic field strength is reduced such that at exterior edges of the vertical shields, distal to the WPT pads 126, 128, the magnetic field strength is less than 5μ Tesla or at least very close to being below 5μ Tesla. In addition, the magnetic field strength above and below the one or more vertical shields 606 and vertical shield retention structure 608 is reduced.

In one embodiment, each vertical shield 606 of the one or more vertical shields 606 is oriented in a plane substantially perpendicular to the WPT pad and each vertical shield 606 is in a different plane. For example, the one or more vertical shields 606 may be stacked next to each other in different planes and may be spaced a fixed distance apart. In another embodiment, the spacing between vertical shields 606 may not be uniform. For example, vertical shields 606 closer to the WPT pads 126, 128 may be closer together than vertical shields 606 further from the WPT pads 126, 128.

In one embodiment, each of the one or more vertical shields 606 include a metal subject to an eddy current when exposed to a magnetic field from the WPT pad (e.g. 126 or 128). For example, the one or more vertical shields 606 may include copper or aluminum where exposure to the magnetic field generated or shaped by a WPT pad 126, 128 causes an eddy current in the copper or aluminum. The one or more vertical shields 606 may be partially or fully made of the metal. For example, a portion of the one or more vertical shields 606 may be metal while a portion may be another material, such as a plastic, an epoxy, etc. that supports the one or more vertical shields 606. In another embodiment, the one or more vertical shields 606 are made completely from a single metal and connect to the vertical shield retention structure 608. For example, the vertical shield retention structure 608 and the one or more vertical shields 606 or a portion of the vertical shield retention structure 608 and one or more vertical shields 606 may be made of the same metal, and in another example, may be formed, cast, etc. from a molten metal or may be milled, cut, etc. from a single piece of metal.

In another embodiment, the one or more vertical shields 606 may be a ferrite material. The ferrite material may shunt the electromagnetic field and may provide a low impedance path for the electromagnetic field. In some embodiments, the one or more vertical shields 606 may include a single ferrite vertical shield 606. In some embodiments, the one or more vertical shields 606 include a plurality of ferrite vertical shields 606.

In one embodiment, a thickness of each vertical shield, a vertical shield size, and/or a vertical shield spacing are chosen to attenuate magnetic flux originating from the WPT pad to within a specified level at a particular distance from the WPT pad. For example, design criteria may be to limit the magnetic field created by the WPT pad to be less than a safety limit at an edge of a vehicle 140, at the edge of an overall WPT pad structure, etc. The number and size of the of the one or more vertical shields 606 may be chosen so that the PMFC structure attenuates the magnetic field to below the chosen criteria. For example, more vertical shields 606 may cause more attenuation than less vertical shields 606. In addition, thicker vertical shields 606 may cause more attenuation than thinner vertical shields 606. The one or more vertical shields 606 may be sized and placed to meet the criteria by a certain chosen design tolerance while also balancing cost of the PMFC structure. Locations of the one or more vertical shields 606 may also be chosen where the magnetic field is desired to be attenuated. Simulation or testing may be used to verify compliance with design criteria.

Other criteria and functions may influence vertical shield design. For example, the one or more vertical shields 606 may be thermally coupled to the WPT pad and/or electronics connected to the WPT pad and a thickness of each vertical shield 606, a vertical shield size, and/or a vertical shield spacing are chosen to transfer heat from the WPT pad and/or the electronics connected to the WPT pad. Cooling requirements may influence vertical shield spacing, sizing, thickness, etc. so that the overall vertical shield design may be chosen to meet multiple requirement. In one embodiment, the one or more vertical shields 606 is thermally coupled to the WPT pad and/or electronics connected to the WPT pad through the vertical shield retention structure 608 so that heat from the WPT pad and/or electronics may be removed through the vertical shield retention structure 608 and then one or more vertical shields 606.

In another embodiment, the vertical shield retention structure 608 is coupled to each of the one or more vertical shields 606 and to the WPT pad for a variety of reasons. For example, for heat removal, to maintain spacing from the WPT pad, for ease of placement, etc. In another embodiment, the vertical shield retention structure 608 includes a non-conductive material located between each of the one or more vertical shields 606. For example, an epoxy or similar material may be poured around the one or more vertical shields 606 to hold the one or more vertical shields 606 in position. The epoxy or similar material may also be used as part of a structure allowing vehicles 140 to travel over the WPT pad and one or more vertical shields 606.

In one embodiment, each of the one or more vertical shields 606 extend away from the vertical shield retention structure 608 in a direction of wireless power transfer. For example, the direction of wireless power transfer may be perpendicular to the WPT pad so the vertical shields are also perpendicular to the WPT pad. In one embodiment where the WPT pad is a transmitter WPT pad, each of the one or more vertical shields 606 extend above the primary WPT pad 126 in the direction of wireless power transfer to a height less than a driving surface over the primary pad 126. In another example where the WPT pad is a secondary pad 128 connected to an underside of a vehicle 140, each of the one or more vertical shields 606 extend below the secondary pad 128 to a height less than a minimum clearance above a driving surface where the vehicle 140 travels.

Figure 7:
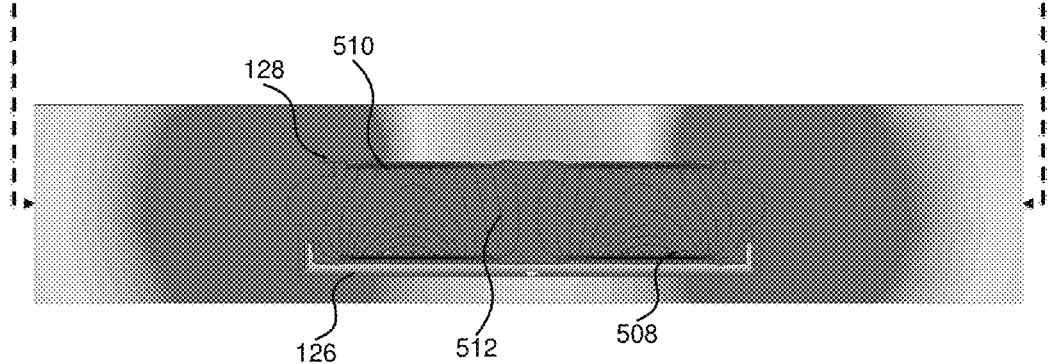
FIG. 7 is a simulation result for a 50 kW WPT system without passive magnetic field attenuation.

FIG. 7 is a simulation result for a 50 kW WPT system 300 without passive magnetic field attenuation. The WPT system 300 is for vehicle 140 charging includes a primary pad 126 with a winding 508 and a secondary pad 128 with a winding 510. Magnetic flux lines 512 are depicted. Simulation and testing show that where the WPT system 300 is used for a bus, the strength of the magnetic field is 3µ Tesla or less at what would be the edge of the vehicle 140. A goal may be to maintain the 3µ Tesla or less at what would be the edge of the vehicle 140 when the system power is increased to 250 kW.

Figure 8:
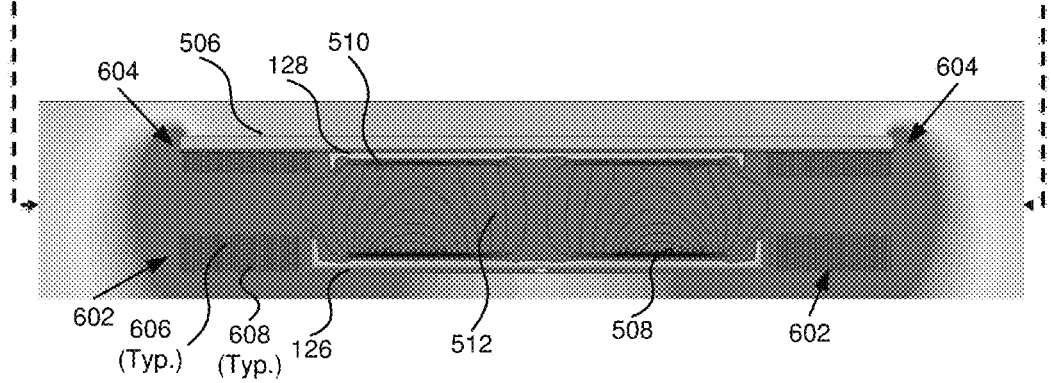
FIG. 8 is a simulation result for a 250 kW WPT system with passive magnetic field attenuation.

FIG. 8 is a simulation result for a 250 kW WPT system 400 with passive magnetic field attenuation. As with the WPT system 100 of FIG. 6, the WPT system 400 includes a passive magnetic flux cancellation ("PMFC") structure depicted with a portion 602 adjacent to either side of the primary pad 126 and a portion 604 adjacent to either side of the secondary pad 128. The PMFC structure includes, for the primary pad 126 and one or more vertical shields 606 oriented substantially perpendicular to the primary pad 126.

FIG. 8 is a simulation and does not show a vertical shield retention structure 608 below the primary pad 126, but it is understood that a vertical shield retention structure 608 would be included that retains the one or more vertical shields 606 in position with respect to the primary pad 126.

The PMFC structure includes, in one embodiment, for the secondary pad 128, one or more vertical shields 606 oriented substantially perpendicular to the secondary pad 128 and a vertical shield retention structure 608 that retains the vertical shields in position with respect to the secondary pad 128. A horizontal shield 506 is included above the secondary pad 128, which reduces the magnetic flux above the secondary pad 128 and may be considered part of the PMFC structure. The horizontal shield 506 may be sized with a width, a length, and a thickness to attenuate the magnetic field above the horizontal shield 506 to below a particular magnetic field strength. In the particular embodiment depicted in FIG. 8, the magnetic field strength at the edges of the vehicle 140, which in this example is a bus, is 18µ Tesla, which may be higher than allowed or higher than a design goal. In the simulation, the height of each vertical shield 606 is 2.57 inches, the horizontal gap between vertical shields 606 is 0.37 inches, and the width of the vertical shields is 0.125 inches. However, the vertical shields were simulated with a material that would not affect the magnetic field in order to illustrate the magnetic field without the one or more vertical shields 606 of the passive field cancellation structure.

Figure 9:
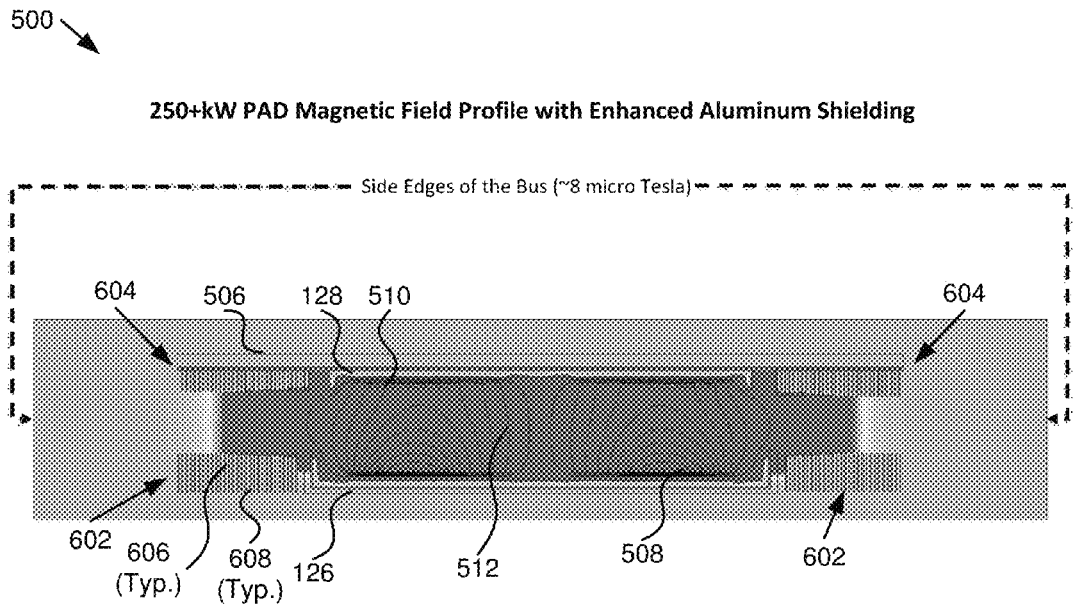
FIG. 9 is a simulation result for a 250 kW WPT system with enhanced passive magnetic field attenuation.

FIG. 9 is a simulation result 500 for a 250 kW WPT system 100 with and enhanced passive magnetic field attenuation. As with the WPT system 400 of FIG. 8, the WPT system 100 includes a passive magnetic flux cancellation ("PMFC") structure depicted with a portion 602 adjacent to either side of the primary pad 126 and a portion 604 adjacent to either side of the secondary pad 128. The PMFC structure includes, for the primary pad 126 and one or more vertical shields 606 oriented substantially perpendicular to the primary pad 126. FIG. 9 is also a simulation and does not show a vertical shield retention structure 608 below the primary pad 126, but it is understood that a vertical shield retention structure 608 would be included that retains the one or more vertical shields 606 in position with respect to the primary pad 126. In the simulation, the height of each vertical shield 606 is 2.57 inches, the horizontal gap between vertical shields 606 is 0.37 inches, and the width of the vertical shields is 0.125 inches and the vertical shields 606 were aluminum.

The PMFC structure includes, in one embodiment, for the secondary pad 128, one or more vertical shields 606 oriented substantially perpendicular to the secondary pad 128 and a vertical shield retention structure 608 that retains the vertical shields in position with respect to the secondary pad 128. A horizontal shield 506 is included above the secondary pad 128, which reduces the magnetic flux above the secondary pad 128 and may be considered part of the PMFC structure. In the particular embodiment depicted in FIG. 9, the horizontal shield 506 is thicker than the WPT system 400 of FIG. 8. In addition, the one or more vertical shields 606 are thicker than the WPT system 400 of FIG. 8. The magnetic field strength at the edges of the vehicle 140, which in this example is a bus, is 8µ Tesla, which is much lower than the WPT systems 300, 400 of FIGS. 7 and 8.

Figure 10:
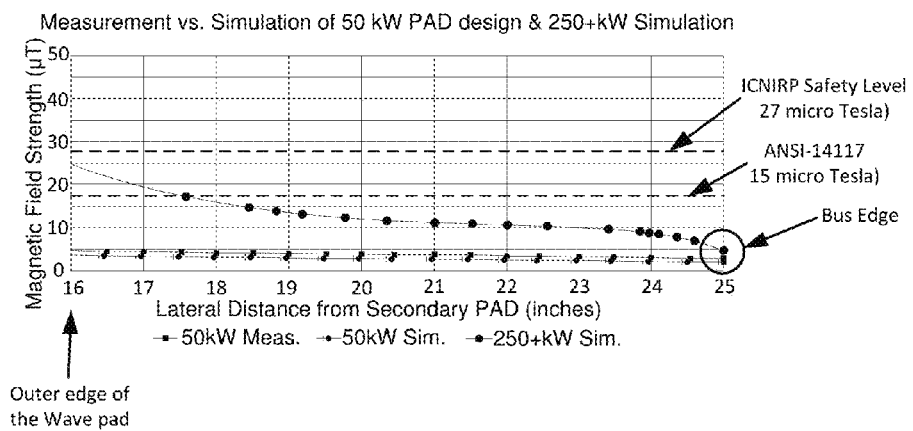
FIG. 10 is a magnetic field safety study with magnetic flux levels at various distances from a center of a receiver pad for a 50 kW system and a 250 kW system.

FIG. 10 is a magnetic field safety study with magnetic flux levels at various distances from a center of a secondary WPT pad for a 50 kW system and a 250 kW system. For the 50 kW system, both measured and simulated magnetic field strength from the outer edge of the WPT pad to the vehicle (bus) edge. The magnetic field strength is lower than the International Commission on Non-Ionizing Radiation Protection ("ICNIRP") safety level of 27 micro Tesla and the American National Standards ("ANSI") Standard 14117 15 micro Tesla limit. For the 250+kW WPT system 500 of FIG. 9, the magnetic field strength is about 25 micro Tesla at the outer edge of the WPT pad, but reduces to 8 micro Tesla at the edge of the vehicle 140 (i.e. a bus) with the PMFC structure in place, which is below the ANSI 14117 and the ICNIRP safety level.

FIG. 11 is a schematic block diagram illustrating parameters of vertical shields of a passive field cancellation apparatus. The one or more vertical shields 606 may be defined with a height, a thickness and are separated by a particular gap width.

Figure 12:
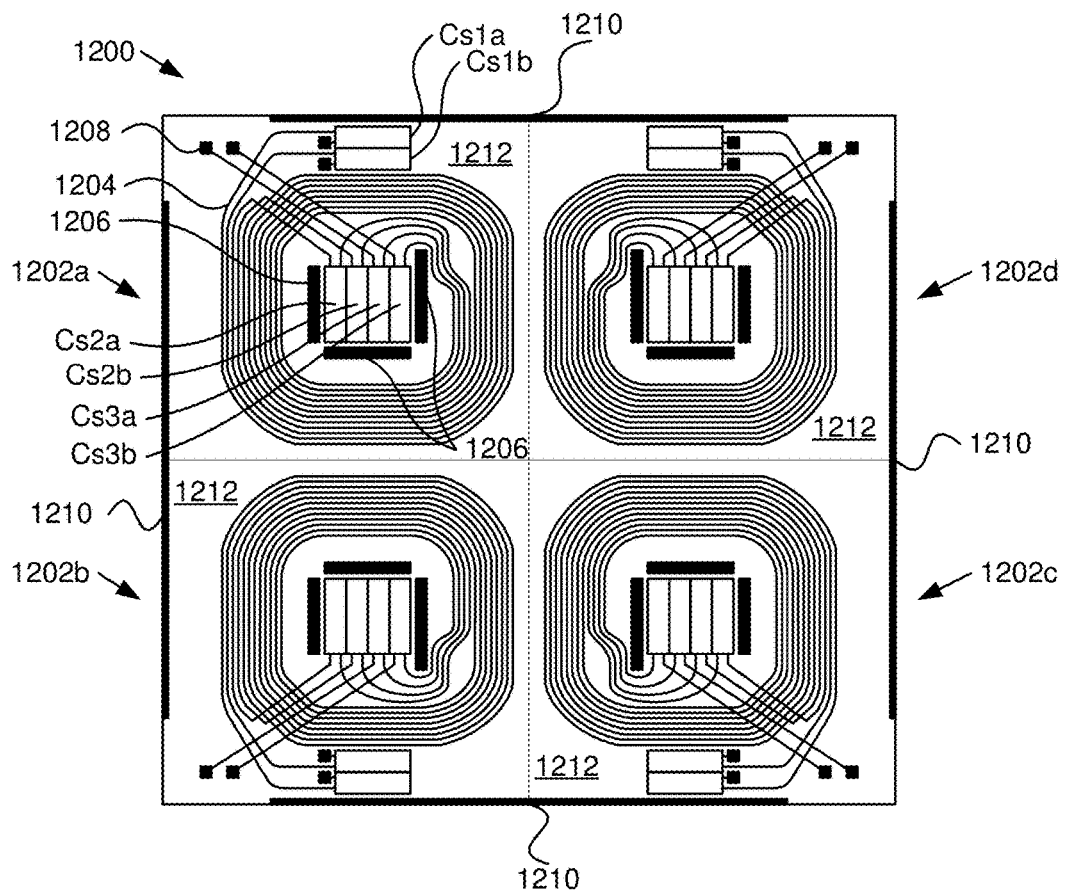
FIG. 12 is a schematic block diagram illustrating one embodiment of a WPT pad with four windings with a ferrite structure removed.

FIG. 12 is a schematic block diagram illustrating one embodiment 1200 of a WPT pad 126, 128 with four windings 1202a, 1202b, 1202c, 1202d (generically or collectively "1202") with a ferrite structure removed. In some embodiments, the windings 1202 are substantially similar to the windings 508, 510 described above. Each winding 1202 is configured with capacitors Cs1a, Cs2a and Cs3a on one winding and Cs1b, Cs2b and Cs3b on the other winding where the windings are in parallel, but other configurations are also contemplated, such as the embodiment 400 of FIG. 4, windings 1202 without intervening capacitors, etc. and the ferrite structure, vertical shields, horizontal shields, four windings 1202 in a two-by-two pattern, etc. described below are applicable to the various winding configurations. The conductors 1204 in the windings 1202 are depicted as lines where the inductances (i.e. Ls1a) are not called out specifically. Each winding 1202 includes a ferrite chimney 1206, which is a ferrite section adjacent to the conductors 1204 of the windings 1202. The ferrite chimney 1206 is described in more detail with regard to FIG. 14. Connection points 1208 are depicted as square boxes. Each winding 1202a, 1202b, 1202c, 1202d is configured the same so for clarity only the first winding 1202a is labeled.

The four windings 1202 are surrounded by vertical shields 1210. Each vertical shield 1210 is located external to the ferrite structure and is positioned to shunt an electromagnetic field radiating in a direction horizontal with a horizontal surface of the ferrite structure. The vertical shields 1210 are described more in relation to FIGS. 13 and 14.

In one embodiment, each of the four windings 1202a-d is wound in a spiral pattern starting at an edge of a winding center section and expanding away from the center section. The center section is an area without conductors at a center of a winding (e.g. 1202a). In one embodiment, the spiral is an Archimedean spiral. In another embodiment, the spiral is a modified Archimedean spiral that is not purely circular, but includes straight sections or other modifications to accommodate the ferrite chimneys 1206, convenience, etc.

Figure 13:
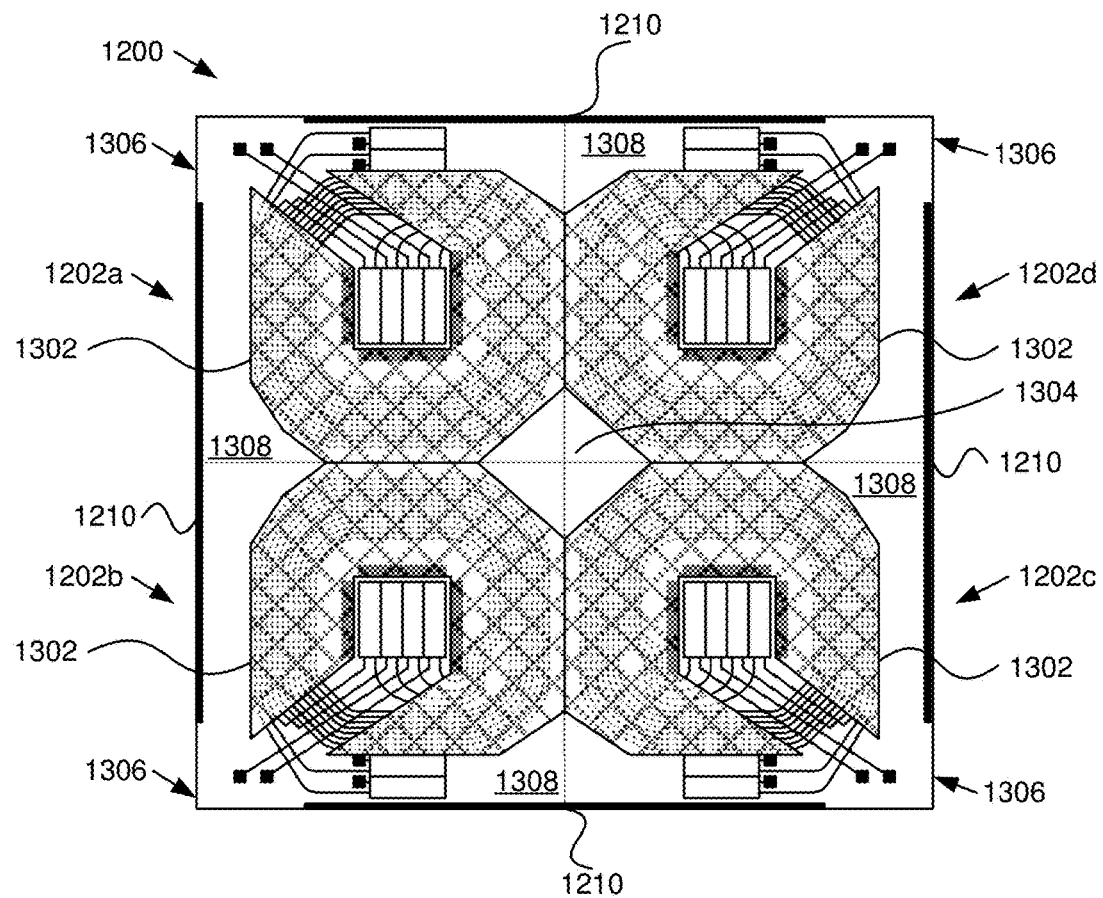
FIG. 13 is a schematic block diagram illustrating one embodiment of a WPT pad with four windings with a ferrite structure included.

FIG. 13 is a schematic block diagram illustrating the embodiment 1200 of the WPT pad 126, 128 with four windings 1202 with a ferrite structure 1302a, 1302b, 1302c, 1302d (generically or collectively "1302") included for each winding 1202a, 1202b, 1202c, 1202d. The four windings 1202a-d are adjacent to the ferrite structure 1302, where a horizontal surface of the ferrite structure 1302 is adjacent to each of the four windings 1202a-d. Each of the four windings 1202a-d are wound in a horizontal pattern that is planar to the horizontal surface. The four windings 1202a-d are arranged in a two-by-two square pattern in a north-south-north-south polarity arrangement.

The ferrite structure 1302a of the first winding 1202a is configured to magnetically connect to the ferrite structure 1302b, 1302d of each adjacent winding 1202b, 1202d to create a low impedance magnetic pathway between each winding 1202. In one embodiment, the ferrite pathway between adjacent windings (e.g. 1202a, 1202b) of the four windings 1202 has a thickness and a width to provide a low impedance, unsaturated magnetic pathway for an electromagnetic field generated by the adjacent windings 1202a, 1202b. For example, the ferrite structure 1302 may be sized for an amount of power wirelessly transferred through the WPT pad 126, 128 to not saturate for an expected electromagnetic field generated by the windings 1202.

In one embodiment, the resultant ferrite structure 1302 includes four separate ferrite structures 1302a-d that are positioned to be adjacent to allow for a low impedance magnetic pathway from one winding (e.g. 1202a) to another winding (e.g. 1202b). For example, the ferrite structures 1302a-d may be touching or are positioned very close to each other. In another embodiment, the ferrite structure 1302 is constructed to be a unitary structure. The ferrite structure 1302 may be a single piece of ferrite or may be constructed of ferrite blocks or similar ferrite pieces.

In one embodiment, the resultant ferrite structure 1302 includes an opening in a center section 1304, where the center section 1304 is located at a center of the two-by-two square pattern of windings 1202 and the center section is external to each of the four windings 1202a-d. Typically, having an opening in the center section 1304 is more cost effective than ferrite placed in the center section 1304. Having ferrite in the center section 1304 may provide little benefit compared to a cost of the ferrite. In another embodiment, the center section 1304 includes ferrite.

The embodiment 1200 includes vertical shields 1210 external to the ferrite structure 1302 positioned to shunt an electromagnetic field radiating in a direction horizontal with a horizontal surface of the ferrite structure 1302. In one embodiment, the vertical shield 1210 includes a metallic plate oriented transverse to the horizontal surface of the ferrite structure 1302. In another embodiment, the vertical shield 1210 has an opening 1306 at each corner of the windings 1202a-d and/or ferrite structure 1302, as depicted. As depicted, the vertical shields 1210 may run along only a part of an edge of the windings 1202.

External to each winding in FIGS. 12 and 13 is a winding structure 1212 that may be used to support the windings, ferrite chimneys 1206, connection points 1208, etc. In some embodiments, the winding structure 1212 is non-magnetic. In some embodiments, the winding structure 1212 is rigid and includes channels, ridges, indentations, etc. to support various components of the windings 1202. In some embodiments, the winding structure 1212 provides insulation between components and has a dielectric breakdown sufficient for voltages anticipated on the primary pad 126 or secondary pad 128. In some embodiments, the winding structure 1212 is a rigid material, such as nylon. In one embodiment, an insulating layer (not shown) is placed between the windings 1202 and the ferrite structure 1302. For example, the insulating layer may meet the FR-4 standard of the National Electrical Manufacturers Association ("NEMA") LI 1-1998 specification, and may be a glass-reinforced epoxy laminate or other similar material.

In one embodiment, the windings 1202 each include conductors 1204 which are a litz wire. The litz wire, in one embodiment, includes fine strands of conductors and some of the strands may be wound and/or woven together. In one embodiment, the litz wire is rectangular shaped with a wide side and a narrow side. The litz wire may bend more readily in a direction transverse to the wide side. In one embodiment, the wide side of the litz wire is oriented transverse to a horizontal surface of the ferrite structure 1302, which may facilitate tighter bends than if the litz wire was oriented with the wide side toward the horizontal surface of the ferrite structure 1302. The litz wire, in one embodiment, is placed in channels in the winding structure 1212 to maintain a particular pattern, spacing, etc. In another embodiment, the winding structure 1212 includes extensions, posts, guides, or the like to facilitate a particular pattern, spacing, etc. of the litz wire.

In one embodiment, the vertical shields 1210 are adjacent to and/or connected to a horizontal shield 1308, which is located adjacent to the ferrite structure 1302 where the ferrite structure 1302 is between the horizontal shield 1308 and the windings 1202. In another embodiment, the vertical shield 1210 is coupled to the horizontal shield 1308. In another embodiment, the vertical shield 1210 is adjacent to the horizontal shield 1308 but is not coupled to the horizontal shield 1308. In one embodiment, the horizontal shield 1308 extends beyond the ferrite structure 1302 and the windings 1202 and may be placed between the ferrite structure 1302 and a vehicle 140 for a secondary pad 128 or between the ferrite structure 1302 and a ground below a primary pad 126. In one embodiment, the horizontal shield 1308 is thermally and/or electrically coupled to the ferrite structure 1302. The horizontal shield 1308 may be a single structure or may be split into multiple horizontal shields 1308, for example a horizontal shield 1308 for each winding 1202a-d. A horizontal shield 1308 that is a single plate may be advantageous to prevent water or another substance from passing beyond the horizontal shield 1308 to the ferrite structure 1302 and/or windings 1202. The horizontal shield 1308 is described in more detail with regard to the embodiment 1400 of FIG. 14.

Figure 14:
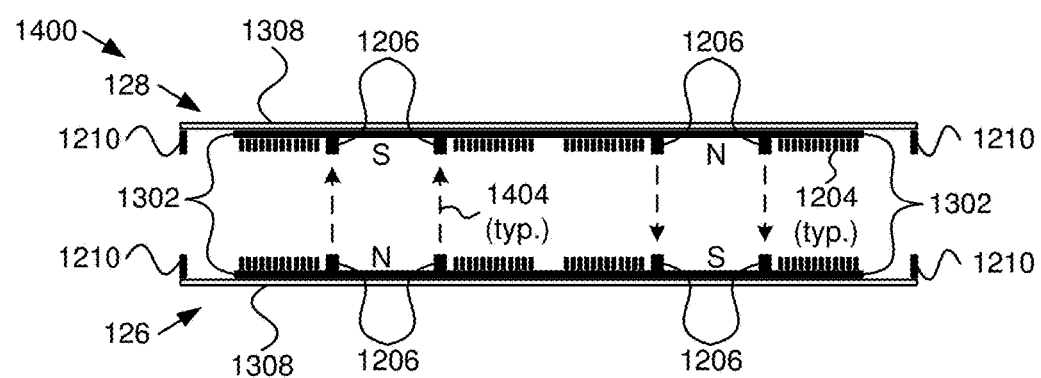
FIG. 14 is a schematic block diagram illustrating one embodiment of a cross section of a primary pad and a secondary pad, each with a ferrite chimney and a vertical shield.

FIG. 14 is a schematic block diagram illustrating one embodiment 1400 of a cross section of a primary pad 126 and a secondary pad 128, each with a ferrite chimney 1206 and a vertical shield 1210. The embodiment 1400 is substantially similar to the embodiment 1200 depicted in FIGS. 12 and 13.

Each of the primary pad 126 and secondary pad 128 include a horizontal shield 1308 with a vertical shield 1210 on an end of the horizontal shield 1308. In the embodiment 1400, the ferrite structure 1302 and conductors 1204 of the windings 1202 are separated from the vertical shields 1210. In another embodiment, the vertical shields 1210 are adjacent to the ferrite structure 1302 and/or conductors 1204. For example, the vertical shields 1210 may be placed within sides of a vehicle 140 to minimize stray electromagnetic field beyond the vehicle 140 where people may be standing.

A width (measured from the horizontal shield 1308 in a direction transverse to the horizontal shield 1308), a thickness, and a material of the vertical shield 1210 may be chosen along with a position of the vertical shields to maintain an electromagnetic field strength below a specified limit where people are located, such as a governmental standard. In addition, the thickness, size, and material of the horizontal shield 1308 may be chosen to reduce an electromagnetic field strength below a specified limit where people are located. In one embodiment, the vertical shield 1210 and/or the horizontal shield 1308 include a metallic material, such as aluminum. One of skill in the art will recognize other metallic materials suitable for the vertical shield 1210 and/or the horizontal shield 1308.

In one embodiment, the primary pad 126 and secondary pad 128 each include a ferrite chimney 1206. The ferrite chimneys 1206 may reduce a distance between the pads 126, 128 and may provide a convenient magnetic pathway 1404 between the pads 126, 128. The ferrite chimneys 1206, in one embodiment, extend at least to a distance away from the ferrite structure 1302 that is at least level with the conductors 1204 of the windings 1202 and may extend beyond the conductors 1204, as depicted in FIG. 14. In one embodiment, the ferrite chimneys 1206 surround a center section, which may include capacitors (e.g. $Cs2a$, $Cs3a$, $Cs2b$, $Cs3b$). Note that the capacitors $Cs2a$, $Cs3a$, $Cs2b$, $Cs3b$ are not shown for clarity, but are intended to be included in the embodiment 1400. In another embodiment, the center section is empty.

The ferrite chimneys 1206 are discussed in more detail in U.S. Patent Application No. 62/554,950 filed Sep. 9, 2017 for Patrice Lethellier, which is incorporated herein by reference for all purposes. In another embodiment, the primary pad 126 includes a pyramid-shaped ferrite chimney (not shown) that is located at a center of each winding, which allows for a degree of misalignment between the pads 126, 128 while maintaining an adequate degree of magnetic coupling. Pyramid-shaped ferrite chimneys are discussed in more detail in U.S. Patent Application No. 62/554,960 filed Sep. 9, 2017 for Patrice Lethellier, which is incorporated herein by reference for all purposes.

North ("N") and south ("S") poles are depicted as well as a magnetic pathway 1404 where electromagnetic flux may travel from north to south poles and then through the ferrite structure 1302. The ferrite structure 1302 extending between windings provides a low impedance magnetic pathway from one winding (e.g. 1202a) to another winding (e.g. 1202b, 1202d), which facilitates efficient transfer of energy wirelessly between the pads 126, 128. In addition, each winding 1202a-d may be connected to a different resonant converter 118 to parallel the resonant converters 118 to increase the wireless power transfer capability of the pads 126, 128. The magnetic pathway formed in the ferrite structure 1302 and the ferrite chimneys 1206, as depicted in FIGS. 13 and 14, help to direct the electromagnetic field generated in the windings 1202 into the ferrite structure 1302 and to minimize stray electromagnetic field external to the ferrite structure 1302, ferrite chimneys 1206 and area directly between the ferrite chimneys 1206, i.e. in locations where the electromagnetic field is not wanted. In addition, the horizontal shields 802 and the vertical shields 1210 help to shunt stray electromagnetic fields to minimize electromagnetic field strength beyond the horizontal shields 802 and the vertical shields 1210.

Figure 15:
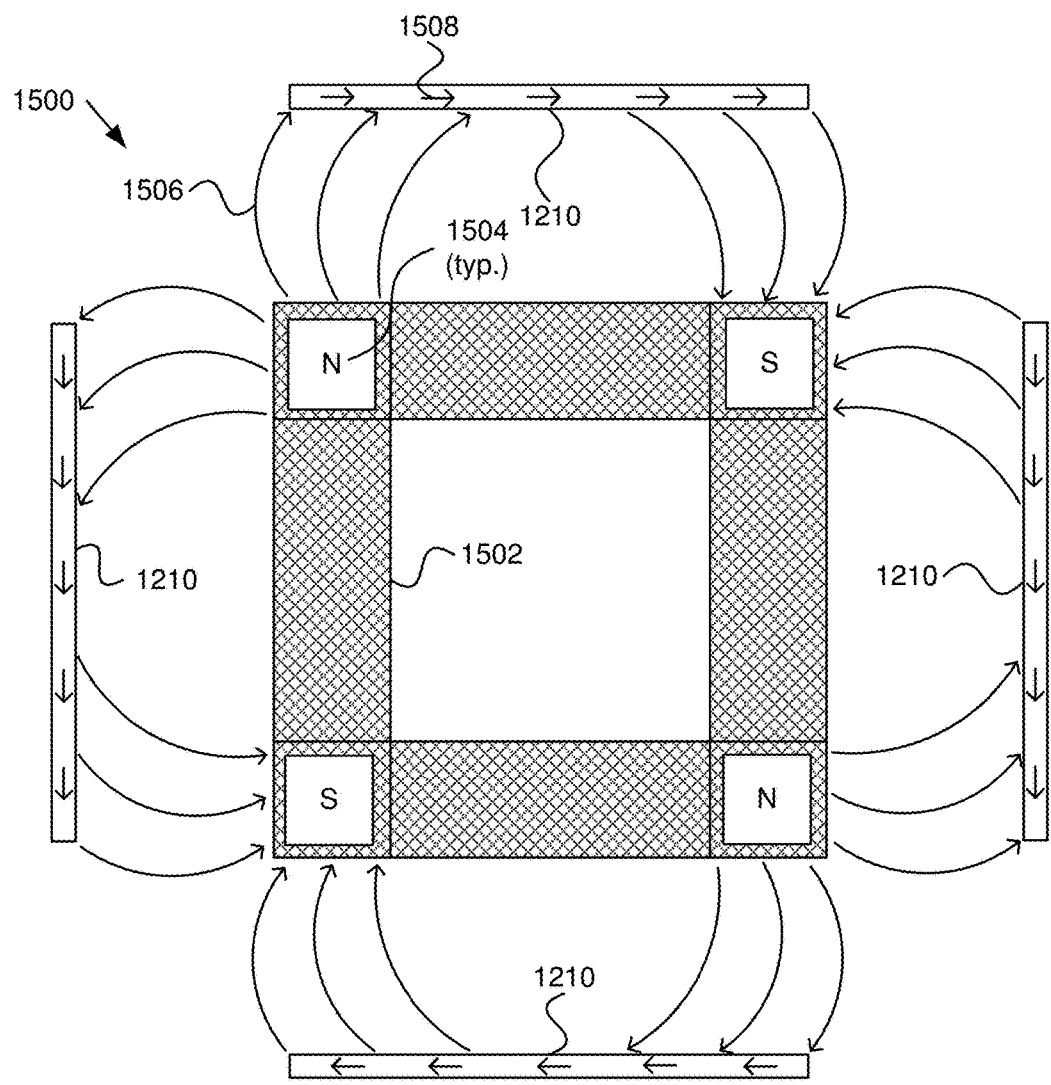
FIG. 15 is a schematic block diagram illustrating one embodiment of a simplified ferrite structure of a four winding WPT pad and vertical shields depicting shunting of a stray electromagnetic field.

FIG. 15 is a schematic block diagram illustrating one embodiment 1500 of a simplified ferrite structure 1502 of a four winding WPT pad (e.g. 126, 128) and vertical shields 1210 depicting shunting of a stray electromagnetic field. The simplified ferrite structure 1502 may represent the ferrite structure of the embodiments 1200, 1400 of FIGS. 13 and 14, but is simply depicted to indicate functionality of the vertical shields 1210. The simplified ferrite structure 1502 include center sections 1504 with north ("N") and south ("S") poles as indicated. Stray electromagnetic field lines 1506 extend beyond the simplified ferrite structure 1502, but are shunted by the vertical shields 1210, as depicted by the field lines 1508 in the vertical shields 1210. The shunting of the stray electromagnetic field 1506 reduces electromagnetic field strength beyond the vertical shields 1210.

Figure 16:
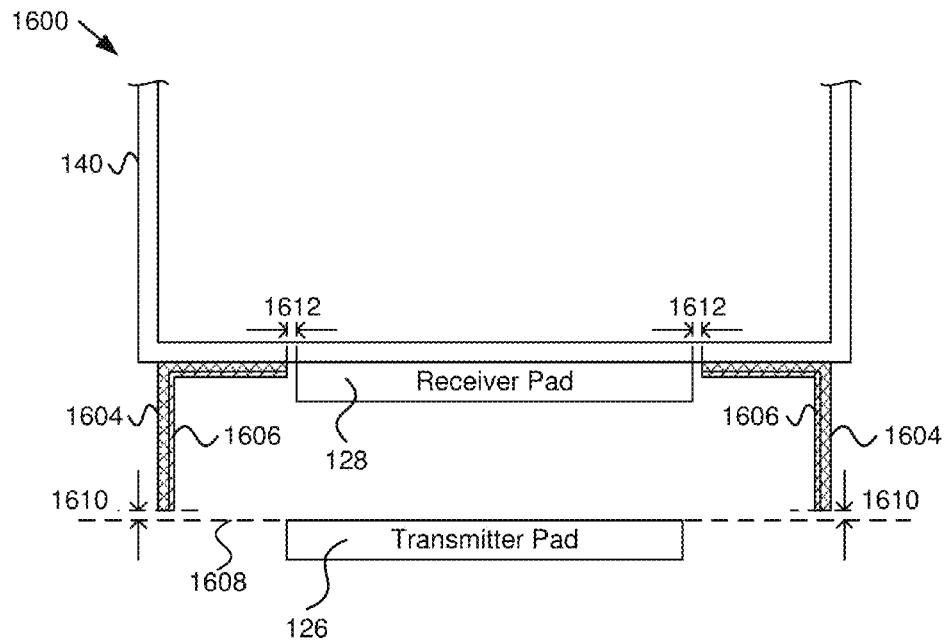
FIG. 16 is a schematic block diagram illustrating a cross section of a vehicle with charging pads and side skirts.

FIG. 16 is a schematic block diagram 1600 illustrating a cross section of a vehicle 140 with charging pads and side skirts. The diagram 1600 is a simplified section view of a vehicle 140, such as a bus, including a secondary pad 128 over a primary pad 126. In the embodiment, the vehicle 140 includes side skirts 1604 with a shielding material 1606. The skirts 1604, in one embodiment, is made of a flexible material, such as rubber, plastic, etc. The skirts 1604 may be similar to those used under semi-trailers, buses, etc. to reduce wind drag.

The skirts 1604 are depicted extending along a bottom of the vehicle 140, but may also be attached where the skirts 1604 contact the vehicle 140. The skirts 1604 runs at least the length of the secondary pad 128 as viewed from the side of the vehicle 140. In other embodiments, the skirts 1604 extend beyond the length of the secondary pad 128. For example, skirts 1604 may extend past the length of the secondary pad 128 where the magnetic field is strong or above specified limits during wireless power transfer. In another embodiment, the skirts 1604 extend a longer distance along the side of the vehicle 140, such as an amount that covers a gap between wheels, an amount to decrease air resistance, etc.

In one embodiment, the skirts 1604 are positioned a distance above the ground 1608. The distance may be a gap 1610 of a specified amount. For example, the gap 1610 may be sized to be just above the ground 1608 an amount so the skirts 1604 are not dragging on the ground 1608, but is as close as practical to minimize magnetic field leakage at the gap 1610. For example, the gap 1610 may be around 1 inch. The gap 1610 may be sized based on the length between wheels of the vehicle 140 and the expected terrain that the vehicle 140 will travel. In another embodiment, the skirts 1604 may be of a material that is flexible and can tolerate occasional contact with the ground 1608.

The skirts 1604 includes a shielding material 1606 along an interior of the skirts 1604. For example, the shielding material 1606 may be aluminum, copper, ferrite or other metal that can attenuate a magnetic field. In one embodiment, the shielding material 1606 is constructed to be flexible. For example, the shielding material 1606 may be laminated, such as with aluminum tape or other conductive tape, which may or may not have a degree of flexibility when installed. in another embodiment, the shielding material 1606 may be layered with an insulating material between the layers. The insulating material may be Kapton® or other similar insulating material. In another example, the shielding material 1606 may have hinges, gaps, etc. to allow flexibility.

As depicted, the shielding material 1606 extends along the bottom of the vehicle 140 to the secondary pad 128. The shielding material 1606, in one embodiment, may stop before the secondary pad 128 so that there is a small gap 1612. Typically, the gap would be minimized to reduce leakage through the gap 1612. The gap 1612 may also be eliminated. In the depicted embodiment of the diagram 1600 in FIG. 16, the skirts 1604 extend along the bottom of the vehicle 140 and the shielding material 1606 is mounted to the skirt 1604 on the underside of the vehicle 140. In another embodiment, at least a portion of the shielding material 1606 is mounted directly to the bottom side of the vehicle 140.

The shielding material 1606 is a suitable thickness to attenuate the magnetic field generated by the primary pad 126 and the secondary pad 128 during wireless power transfer. For example, the shielding material 1606 may be ⅛-inch-thick aluminum. The thickness of the shielding material 1606 may be chosen based on strength of the magnetic field and the material chosen. The thickness of the shielding material 1606 may also be selected based on distance from the secondary pad 128 and the primary pad 126.

In one embodiment, the shielding material 1606 is selected based on no other passive shielding. In another embodiment, the shielding material 1606 is selected based on other passive shielding, such as vertical shields, horizontal shields, etc. as described above on the primary pad 126, the secondary pad 128 or both.

Figure 17:
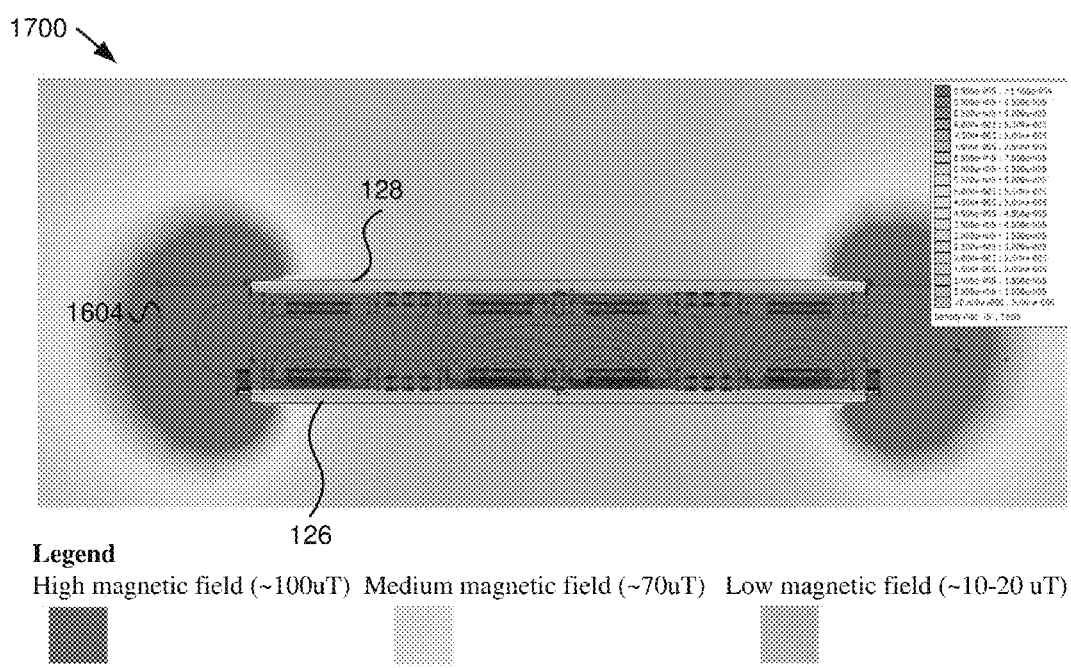
FIG. 17 is a simulation result for a 62.5 kW WPT system without enhanced passive magnetic field attenuation.

FIG. 17 is a simulation 1700 result for a 62.5 kW WPT system without enhanced passive magnetic field attenuation in the form of skirts 1604. The skirts 1604 depicted are simulated as air to not affect the simulation. The simulation 1700 includes vertical shields on the primary pad 126 as described above, but the vertical shields depicted on the secondary pad 128 are simulated as air to not affect the simulation 1700. Note that a strong magnetic field, depicted by the pink areas in the simulation 1700, is present beyond the skirts 1604.

Figures 18, 19:
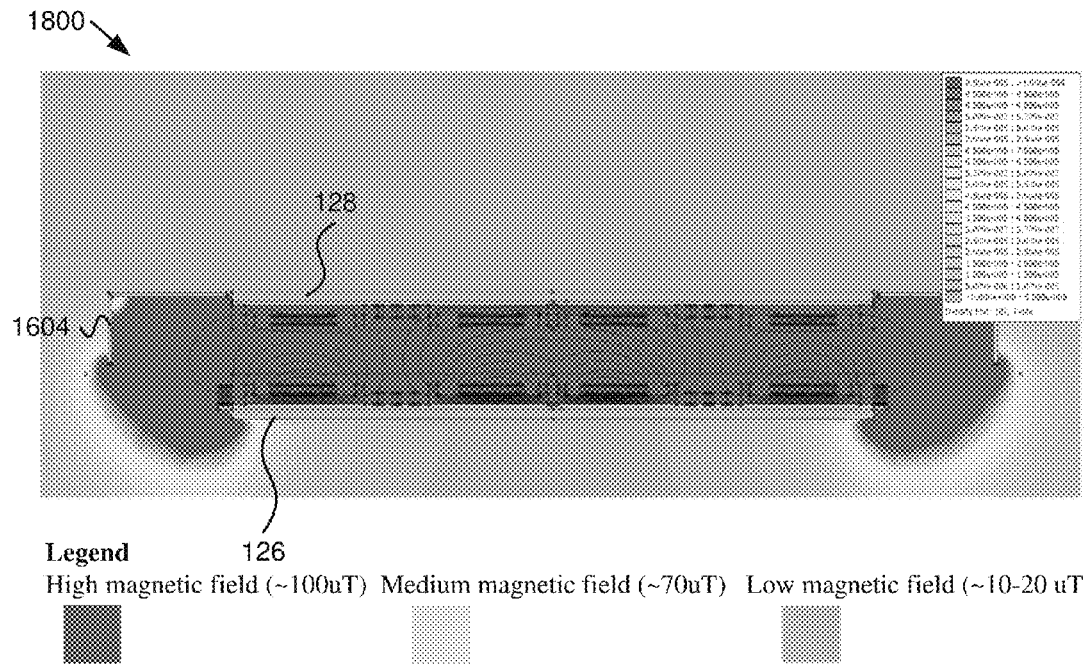
FIG. 18 is a simulation result for a 62.5 kW WPT system with enhanced passive magnetic field attenuation in the form of an aluminum side skirt.
FIG. 19 is a simulation result for a 62.5 kW WPT system with enhanced passive magnetic field attenuation in the form of an aluminum side skirt positioned inward 3 inches from the simulation result of FIG. 10.

FIG. 18 is a simulation 1800 result for a 62.5 kW WPT system with enhanced passive magnetic field attenuation in the form of an aluminum side skirt. The skirts 1604 are simulated as including shielding material 1606 (not shown) that is ⅛-inch-thick aluminum. Again, the simulation 1800 includes vertical shields on the primary pad 126 as described above, but the vertical shields depicted on the secondary pad 128 are simulated as air to not affect the simulation 1800. The magnetic field strength is considerably attenuated beyond the skirts 1604 and shielding material 1606 as compared to the simulation 1700 of FIG. 17. Note that the ground 1608 is not shown, but would be close to the bottom of the skirts 1604. Therefore, the strong magnetic field shown below the skirts 1604 would be in the ground 1608, which typically would not affect people near the vehicle 140.

FIG. 19 is a simulation 1900 result for a 62.5 kW WPT system with enhanced passive magnetic field attenuation in the form of an aluminum side skirt positioned inward 3 inches from the simulation result of FIG. 10. While there is some increase in magnetic field strength around the bottom of the skirts 1604, the magnetic field is attenuated above and to the external side of the skirts 1604 are about the same as the simulation 1800 of FIG. 19. Moving the skirts 1604 inward moves may be beneficial to provide more of a buffer between the magnetic field and people.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
    a wireless power transfer ("WPT") pad comprising one or more windings and a ferrite structure adjacent to the one or more windings; and
    a passive magnetic flux cancellation ("PMFC") structure located adjacent to the WPT pad, the PMFC structure comprising
        one or more vertical shields oriented substantially perpendicular to the WPT pad; and
        a vertical shield retention structure that retains each of the one or more vertical shields in position with respect to the WPT pad,
        wherein one or more of a thickness of each vertical shield, a vertical shield size, and a vertical shield spacing are chosen to attenuate magnetic flux originating from the WPT pad to within a specified level at a particular distance from the WPT pad.

2. The apparatus of claim 1, wherein each vertical shield of the one or more vertical shields is oriented in a plane substantially perpendicular to the WPT pad, wherein each vertical shield is in a different plane.

3. The apparatus of claim 1, wherein a portion of each of the one or more vertical shields is located adjacent to each side of the WPT pad, each side of the WPT pad is perpendicular to a direction of wireless power transfer of the WPT pad, the direction of wireless power transfer comprising a direction where another pad is aligned to engage in wireless power transfer.

4. The apparatus of claim 1, wherein each of the one or more vertical shields is placed in one or more locations adjacent to the WPT pad where magnetic flux originating in the WPT pad is not useful for wireless power transfer with another WPT pad.

5. The apparatus of claim 1, wherein each of the one or more vertical shields comprise a metal subject to an eddy current when exposed to a magnetic field from the WPT pad.

6. The apparatus of claim 5, wherein each of the one or more vertical shields comprise one or more of aluminum and copper.

7. The apparatus of claim 1, wherein each of the one or more vertical shields comprise a ferrite material with a size and thickness to shunt an electromagnetic field generated by the windings and present at the one or more vertical shields.

8. The apparatus of claim 1, wherein one or more of a thickness of each vertical shield, a vertical shield size, and a vertical shield spacing are chosen to attenuate magnetic flux originating from the WPT pad to within a specified level at a particular distance from the WPT pad.

9. The apparatus of claim 1, wherein the one or more vertical shields is thermally coupled to one or more of the WPT pad and electronics connected to the WPT pad and one or more of a thickness of each vertical shield, a vertical shield size, and a vertical shield spacing are chosen to transfer heat from one or more of the WPT pad and the electronics connected to the WPT pad.

10. The apparatus of claim 9, wherein the one or more vertical shields are thermally coupled to one or more of the WPT pad and electronics connected to the WPT pad through the vertical shield retention structure.

11. The apparatus of claim 1, wherein the vertical shield retention structure is coupled to each of the one or more vertical shields and to the WPT pad.

12. The apparatus of claim 1, wherein the vertical shield retention structure comprises two or more parts, each part of the vertical shield retention structure adjacent to a side of the WPT pad where magnetic flux attenuation is desired.

13. The apparatus of claim 1, wherein the vertical shield retention structure comprises a non-conductive material located between each of the one or more vertical shields.

14. The apparatus of claim 1, wherein each of the one or more vertical shields extend away from the vertical shield retention structure in a direction of wireless power transfer.

15. The apparatus of claim 14, wherein the WPT pad is a transmitter WPT pad and each of the one or more vertical shields extend above the transmitter WPT pad in the direction of wireless power transfer to a height less than a driving surface over the transmitter WPT pad.

16. The apparatus of claim 14, wherein the WPT pad is a receiver WPT pad connected to an underside of a vehicle and each of the one or more vertical shields extend below the receiver WPT pad to a height less than a minimum clearance above a driving surface where the vehicle travels.

17. An apparatus comprising:
 a wireless power transfer ("WPT") pad comprising one or more windings and a ferrite structure adjacent to the one or more windings; and
 a passive magnetic flux cancellation ("PMFC") structure located adjacent to the WPT pad, the PMFC structure comprising
  a vertical shield oriented substantially perpendicular to the WPT pad, wherein the vertical shields comprises a ferrite; and
  a vertical shield retention structure that retains the vertical shield in position with respect to the WPT pad,
  wherein one or more of a thickness of each vertical shield, a vertical shield size, and a vertical shield spacing are chosen to attenuate magnetic flux originating from the WPT pad to within a specified level at a particular distance from the WPT pad.

18. The apparatus of claim 17, wherein the vertical shield is oriented in a plane substantially perpendicular to the WPT pad.

19. The apparatus of claim 17, wherein the ferrite material comprises a size and thickness to shunt an electromagnetic field generated by the windings and present at the vertical shield.

20. An apparatus comprising:
 a wireless power transfer ("WPT") pad comprising one or more windings and a ferrite structure adjacent to the one or more windings; and
 a passive magnetic flux cancellation ("PMFC") structure located adjacent to the WPT pad, the PMFC structure comprising
  a plurality of vertical shields oriented substantially perpendicular to the WPT pad, wherein each of the plurality of vertical shields attenuates an electromagnetic field, wherein each of the plurality of vertical shields comprises a metal subject to an eddy current when exposed to a magnetic field from the WPT pad; and
  a vertical shield retention structure that retains each of the plurality of vertical shields in position with respect to the WPT pad,
  wherein one or more of a thickness of each vertical shield, a vertical shield size, and a vertical shield spacing are chosen to attenuate magnetic flux originating from the WPT pad to within a specified level at a particular distance from the WPT pad.

* * * * *